(12) United States Patent
Lim et al.

(10) Patent No.: US 9,300,282 B2
(45) Date of Patent: Mar. 29, 2016

(54) SEMICONDUCTOR DEVICE AND SEMICONDUCTOR SYSTEM INCLUDING THE SAME

(71) Applicant: SK hynix Inc., Gyeonggi-do (KR)

(72) Inventors: Yu-Ri Lim, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/286,725

(22) Filed: May 23, 2014

(65) Prior Publication Data

US 2015/0155861 A1 Jun. 4, 2015

(30) Foreign Application Priority Data

Dec. 4, 2013 (KR) .......................... 10-2013-0149738

(51) Int. Cl.
*H03K 5/131* (2014.01)
*H03K 5/133* (2014.01)
*H03K 5/135* (2006.01)
*H03K 5/13* (2014.01)
H03K 5/00 (2006.01)

(52) U.S. Cl.
CPC ................ *H03K 5/131* (2013.01); *H03K 5/133* (2013.01); *H03K 5/135* (2013.01); *H03K 2005/00058* (2013.01)

(58) Field of Classification Search
CPC ........... H03K 5/00; H03K 5/13; H03K 5/131; H03K 5/133; H03K 5/135; H03K 2005/00; H03K 2005/00058

USPC ........................................................ 327/276
See application file for complete search history.

(56) References Cited

U.S. PATENT DOCUMENTS

| 8,232,826 B1 * | 7/2012 | Nguyen et al. ................ 327/261 |
| 8,837,562 B1 * | 9/2014 | Betts et al. .................... 375/219 |
| 2005/0195009 A1 * | 9/2005 | Mack et al. ................... 327/235 |
| 2012/0254528 A1 * | 10/2012 | Na et al. ....................... 711/105 |

FOREIGN PATENT DOCUMENTS

KR 1020120111281 10/2012

* cited by examiner

*Primary Examiner* — John Poos
*Assistant Examiner* — David Mattison
(74) *Attorney, Agent, or Firm* — IP & T Group LLP

(57) ABSTRACT

A semiconductor device includes a first pad suitable for receiving a first clock that is inputted from an exterior, a second pad suitable for receiving a second clock that is inputted from the exterior, a differential clock recognition unit suitable for recognizing between the first clock and the second clock as a positive clock of differential clocks and recognizing the other as a negative clock of the differential clocks in response to a mirror function signal which represents whether a mirror function is enabled or not, an output unit suitable for outputting an internal signal as an output signal in response to the differential clocks and controlling an output moment of the output signal in response to the mirror function signal and an output moment control signal, and a third pad suitable for supplying the output signal to the exterior.

18 Claims, 10 Drawing Sheets

SEMICONDUCTOR DEVICE AND SEMICONDUCTOR SYSTEM INCLUDING THE SAME

CROSS-REFERENCE TO RELATED APPLICATIONS

The present application claims priority of Korean Patent Application No. 10-2013-0149738, filed on Dec. 4, 2013, which is incorporated herein by reference in its entirety.

BACKGROUND

1. Field

Exemplary embodiments of the present invention relate to a semiconductor designing technology, and more particularly, to a semiconductor device using a clock and a semiconductor system including the semiconductor device.

2. Description of the Related Art

A semiconductor device operates at a predetermined rate in a semiconductor system. The semiconductor device is in need of a clock to operate at the predetermined rate. The clock is generated from a control device in the semiconductor system and it pulses at a predetermined frequency.

Differential clocks having two signals that are opposite in phase will be discussed herein. Since the differential clocks are characteristically resistant to noise when recognized or amplified, they may support a secure semiconductor system with operational reliability.

Figure 1:
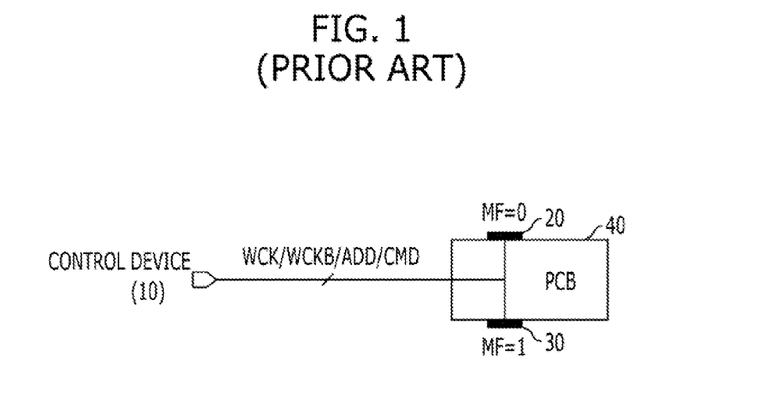
FIG. 1 is a block view of a typical semiconductor system.

FIG. 1 is a block view of a typical semiconductor system. Referring to FIG. 1, the semiconductor system includes a control device 10, first and second semiconductor devices 20 and 30, and a substrate 40. The control device 10 generates differential clocks WCK and WCKB, an address ADD, and various commands CMD. The first and second semiconductor devices 20 and 30 perform predetermined operations in response to the differential clocks WCK and WCKB, the address ADD, and the various commands CMD. The substrate 40 includes a routing path for transferring the differential clocks WCK and WCKB, the address ADD, and the various commands CMD.

Herein, the control device 10 includes a processor such as a Graphic Processing Unit (GPU).

The first and second semiconductor devices 20 and 30 include a memory device, such as a Dynamic Random Access Memory (DRAM) device. The first semiconductor device 20 is mounted on one side of the substrate 40, while the second semiconductor device 30 is mounted on the other side of the substrate 40 (the devices are mounted facing each other in a mirrored structure). The first semiconductor device 20 will be referred to as the main semiconductor device, and the second semiconductor device 30 is referred to as the mirrored semiconductor device.

The main semiconductor device 20 and the mirrored semiconductor device 30 have a mirrored structure relative to each other making the array of pads opposite to each other. The same signal is inputted to the pads of both semiconductor devices 20 and 30 through the routing path of the substrate 40. Both the main semiconductor device 20 and the mirrored semiconductor device 30 each have positive and negative clock pads. The positive clock WCK of the differential clocks WCK and WCKB is inputted to the positive clock pad of the main semiconductor device 20 and the negative clock pad of the mirrored semiconductor device 30. A negative clock WCKB of the differential clocks WCK and WCKB is inputted to the negative clock pad of the main semiconductor device 20 and the positive clock pad of the mirrored semiconductor device 30.

A signal may be inputted to the main semiconductor device 20 through a designated pad and not inputted to the mirrored semiconductor device 30. A signal representing which semiconductor device is mirrored, called the mirror function signal, is therefore required.

The mirror function signal MF is disabled in the main semiconductor device 20 (MF=0) while the mirror function signal MF is enabled in the mirrored semiconductor device 30 (MF=1). The main semiconductor device 20 uses the signals inputted through the corresponding pads in response to the disabled mirror function signal MF, whereas the mirrored semiconductor device 30 uses the signals inputted through the corresponding pads by internally reallocating them in response to the enabled mirror function signal MF.

Figure 2:
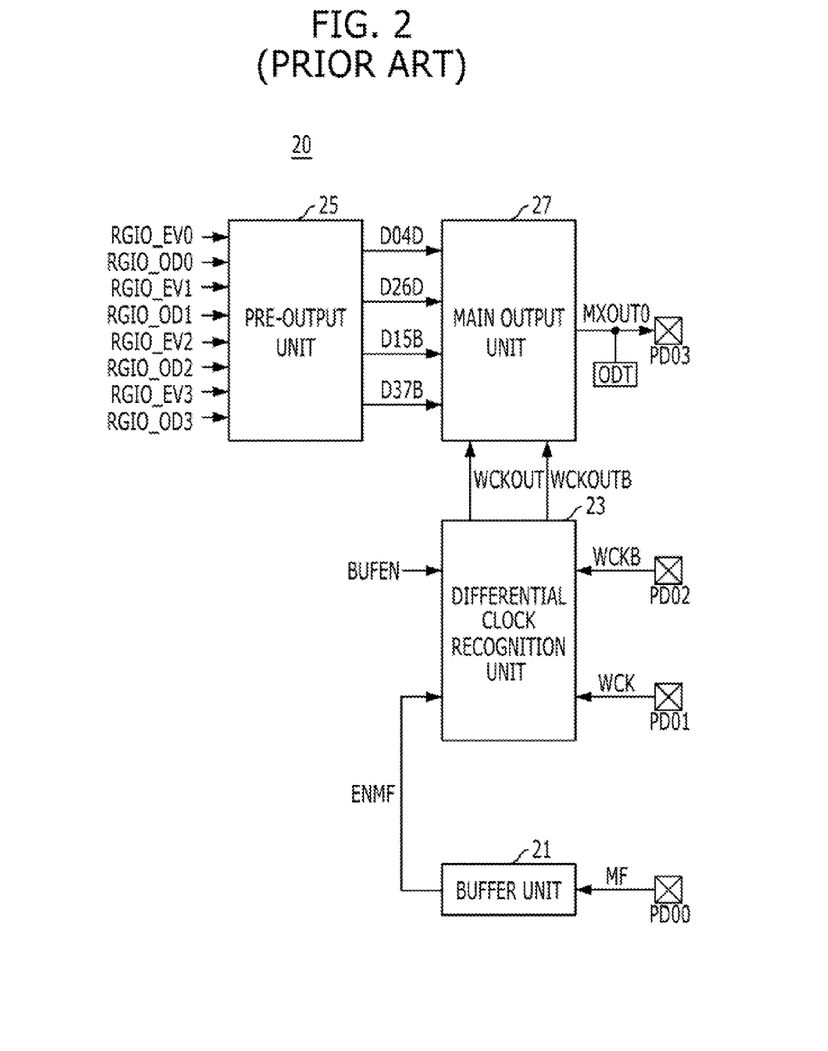
FIG. 2 is a block view illustrating a main semiconductor device 20 shown in FIG. 1.

FIG. 2 is a block view illustrating an internal structure of the main semiconductor device 20 shown in FIG. 1. Referring to FIG. 2, the main semiconductor device 20 includes a buffer unit 21, a differential clock recognition unit 23, a pre-output unit 25, and a main output unit 27. The buffer unit 21 generates a mirror function enable signal ENMF by buffering a mirror function signal MF inputted through a mirror function pad PD00. The differential clock recognition unit 23 recognizes a positive clock WCK inputted through a positive clock pad PD01 as an internal positive clock WCKOUT and recognizes a negative clock WCKB inputted through a negative clock pad PD02 as an internal negative clock WCKOUTB in response to the mirror function enable signal ENMF and an operation enable signal BUFEN. The pre-output unit 25 serializes first to eighth internal parallel data RGIO_EV0 to RGIO_OD3 in pairs and outputs first to fourth pre-parallel data D04D to D37B. The main output unit 27 serially outputs the first to fourth pre-parallel data D04D to D37B through a data pad PD03 in response to the internal differential clocks WCKOUT and WCKOUTB.

Herein, the mirror function signal MF includes a signal that is fixed at a predetermined voltage level. For example, the mirror function pad PD00 is coupled with a ground voltage terminal (not shown in the drawing), and thus the mirror function signal MF is disabled to a logic low level (MF=0).

Meanwhile, the differential clock recognition unit 23 recognizes that the predetermined positive clock WCK and negative clock WCKB are inputted through the positive clock pad PD01 and the negative clock pad PD02 based on the disabled mirror function enable signal ENMF, and outputs the positive clock WCK and the negative clock WCKB as an internal positive clock WCKOUT and an internal negative clock WCKOUTB.

Figure 3:
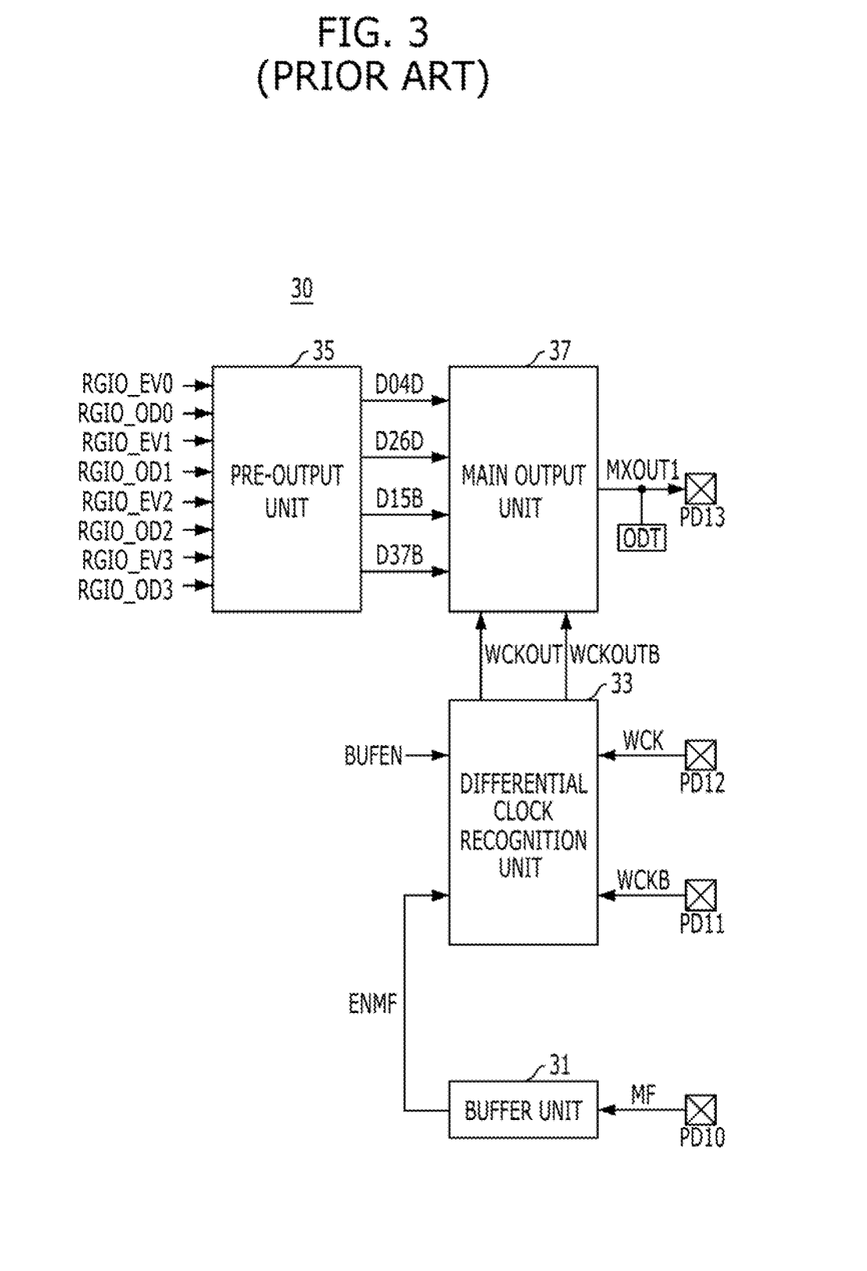
FIG. 3 is a block view illustrating a mirrored semiconductor device 30 shown in FIG. 1.

FIG. 3 is a block view illustrating an internal structure of the mirrored semiconductor device 30 shown in FIG. 1. Referring to FIG. 3, the mirrored semiconductor device 30 includes a buffer unit 31, a differential clock recognition unit 33, a pre-output unit 35, and a main output unit 37. The buffer unit 31 generates a mirror function enable signal ENMF by buffering a mirror function signal MF inputted through a mirror function pad PD10. The differential clock recognition unit 33 recognizes a negative clock WCKB inputted through a positive clock pad PD11 as an internal negative clock WCKOUTB and recognizes a positive clock WCK inputted through a negative clock pad PD12 as an internal positive clock WCKOUT in response to the mirror function enable signal ENMF and an operation enable signal BUFEN. The pre-output unit 35 serializes first to eighth internal parallel data RGIO_EV0 to RGIO_OD3 in pairs and outputs first to fourth pre-parallel data D04D to D37B. The main output unit 37 serially outputs the first to fourth pre-parallel data D04D to D37B through a data pad PD13 in response to the internal differential clocks WCKOUT and WCKOUTB.

Herein, the mirror function signal MF includes a signal that is fixed at a predetermined voltage level. For example, the main mirror function pad PD10 is coupled with a power supply voltage terminal (not shown in the drawing), and thus the mirror function signal MF is enabled to a logic high level (MF=1).

The differential clock recognition unit 33 recognizes that the negative clock WCKB and the positive clock WCK, which should not be inputted, are inputted through the positive clock pad PD11 and the negative clock pad PD12 based on the enabled mirror function enable signal ENMF, reallocates the positive clock WCK and the negative clock WCKB, and outputs an internal positive clock WCKOUT and an internal negative clock WCKOUTB.

Figure 4:
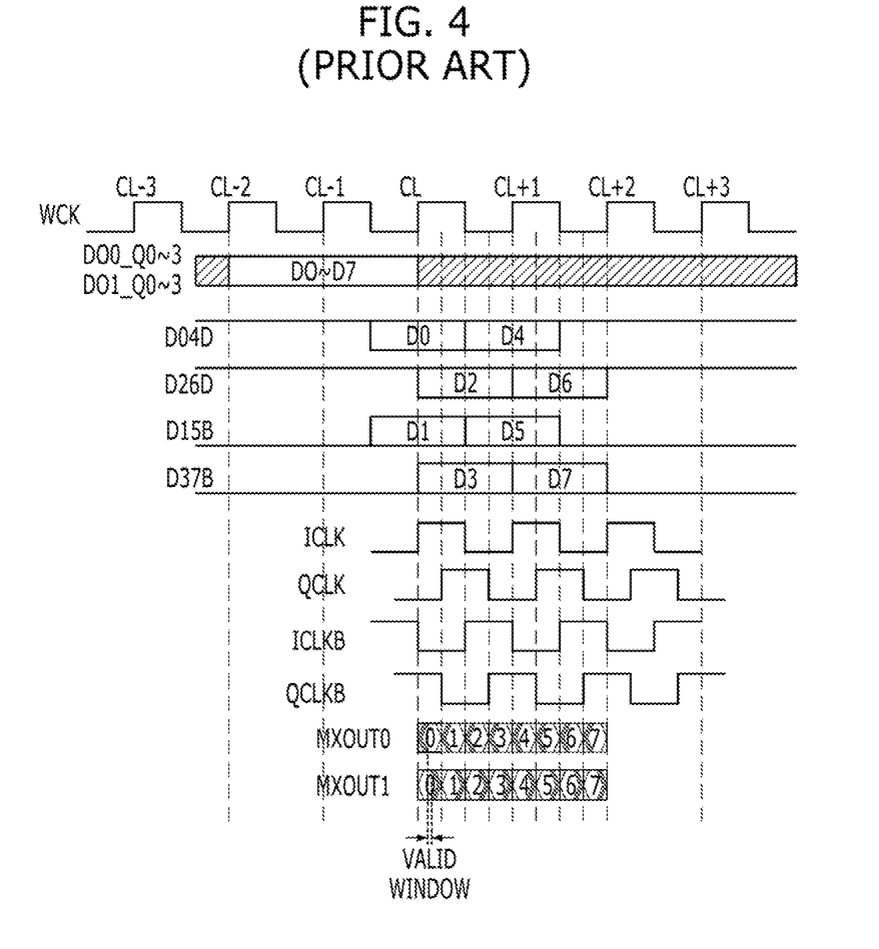
FIG. 4 is a timing diagram describing the operation of the semiconductor system illustrated in FIG. 1.

Described hereafter is an operation of the semiconductor system having the above-described structure with reference to FIG. 4.

FIG. 4 is a timing diagram describing the operation of the semiconductor system illustrated in FIG. 1. Referring to FIG. 4, the main semiconductor device 20 and the mirrored semiconductor device 30 perform a data read operation under the control of the control device 10. For example, the main semiconductor device 20 and the mirrored semiconductor device 30 perform a read operation in response to differential clocks WCK and WCKB, a read command CMD, and row and column addresses ADD.

First, the operation of the main semiconductor device 20 is described. Referring to. FIG. 2, the differential clock recognition unit 23 recognizes and outputs a clock WCK inputted through the positive clock pad PD01 as an internal positive clock WCKOUT and recognizes and outputs a clock WCKB inputted through the negative clock pad PD02 as an internal negative clock WCKOUTB in response to a disabled mirror function enable signal ENMF.

In this state, the pre-output unit 25 serializes the first to eighth internal parallel data RGIO_EV0 to RGIO_OD3 that are read through a read operation in pairs and outputs first to fourth pre-parallel data D04D to D37B. The main output unit 27 serially outputs the first to fourth pre-parallel data D04D to D37B through the data pad PD03 in response to the internal differential clocks WCKOUT and WCKOUTB. The main output unit 27 generates first to fourth divided clocks ICLK to QCLKB by dividing the internal differential clocks WCKOUT and WCKOUTB, and serially outputs the first to fourth pre-parallel data D04D to D37B through the data pad PD03 in response to the first to fourth divided clocks ICLK to QCLKB.

Subsequently, the operation of the mirrored semiconductor device 30 is described. The differential clock recognition unit 33 recognizes and outputs a clock WCKB inputted through the positive clock pad PD11 as an internal negative clock WCKOUTB and recognizes and outputs a clock WCK inputted through the negative clock pad PD12 as an internal positive clock WCKOUT in response to an enabled mirror function enable signal ENMF.

In this state, the pre-output unit 35 serializes the first to eighth internal parallel data RGIO_EV0 to RGIO_OD3 that are read through a read operation in pairs and outputs first to fourth pre-parallel data D04D to D37B. The main output unit 37 serially outputs the first to fourth pre-parallel data D04D to D37B through the data pad PD13 in response to the internal differential clocks WCKOUT and WCKOUTB. The main output unit 37 generates first to fourth divided clocks ICLK to QCLKB by dividing the internal differential clocks WCKOUT and WCKOUTB, and serially outputs the first to fourth pre-parallel data D04D to D37B through the data pad PD13 in response to the first to fourth divided clocks ICLK to QCLKB.

According to the read operation described above, the main semiconductor device 20 and the mirrored semiconductor device 30 output read data MXOUT0 and MXOUT1 to the control device 10 at the same time theoretically. To be specific, the main semiconductor device 20 and the mirrored semiconductor device 30 output the read data MXOUT0 and MXOUT1 through the data pads PD03 and PD13 after a Column Address Strobe (CAS) latency CL passes from a moment when the read command CMD is inputted. Therefore, the control device 10 judges the read data MXOUT0 and MXOUT1 at a predetermined judge point.

The main semiconductor device 20 and the mirrored semiconductor device 30 may have different skew reflected into the read data MXOUT0 and MXOUT1 due to a mismatch that is different for each device. For example, if there is a mismatch between a layout of a transfer line through which the positive clock WCK is transferred and a layout of a transfer lime through which the negative clock WCKB is transferred, the read data MXOUT0 outputted from the main semiconductor device 20 and the read data MXOUT1 outputted from the mirrored semiconductor device 30 may have different skew.

As illustrated in FIG. 4, the read data MXOUT0 outputted from the main semiconductor device 20 has skew from a data eye pattern to the left side, whereas the read data MXOUT1 outputted from the mirrored semiconductor device 30 has skew from the data eye to the right side. In this case, the valid window that is in common between the read data MXOUT0 and MXOUT1 becomes so small that the control device 10 suffers a failure occurring when it judges the read data MXOUT0 and MXOUT1 at a predetermined judge point.

SUMMARY

An embodiment of the present invention is directed to a semiconductor device capable of controlling a signal whose skew becomes different depending on a mirror function, and a semiconductor system including the semiconductor device.

In accordance with an embodiment of the present invention, a semiconductor device includes: a first pad suitable for receiving a first clock that is inputted from an exterior; a second pad suitable for receiving a second clock that is inputted from the exterior; a differential clock recognition unit suitable for recognizing either the first clock or the second clock as a positive clock of differential clocks and recognizing the other as a negative clock of differential clocks in response to a mirror function signal which represents whether a mirror function is enabled or not; an output unit suitable for outputting an internal signal as an output signal in response to the differential clocks and controlling an output moment of the output signal in response to the mirror function signal and an output moment control signal; and a third pad suitable for supplying the output signal to the exterior.

The output unit may delay the internal signal by a delay time and output a delayed internal signal as the output signal.

In accordance with another embodiment of the present invention, a semiconductor device includes a first pad suitable for receiving a first clock that is inputted from an exterior; a second pad suitable for receiving a second clock that is inputted from the exterior; a selection control unit suitable for generating a selection control signal in response to a buffer enable signal and a mirror function signal which represents whether a mirror function is enabled or not; a differential clock buffer unit suitable for outputting either the first clock or the second clock as a positive clock of differential clocks and outputting the other as a negative clock of the differential clocks in response to the selection control signal; a synchronization block unit suitable for outputting internal parallel data as internal serial data in response to the differential clocks; an output moment control unit suitable for controlling an output moment of the internal serial data in response to the mirror function signal and an output moment control signal; and a third pad suitable for supplying an output signal outputted from the output moment control unit to the exterior.

The output moment control unit may include an output control portion suitable for generating an output delay signal in response to the mirror function signal and the output moment control signal, and a delay output portion suitable for outputting the output data by selectively delaying the internal serial data by a delay time in response to the output delay signal.

In accordance with yet another embodiment of the present invention, a semiconductor system includes: a control device suitable for generating differential clocks; a first semiconductor device suitable for outputting a first internal output data in response to the differential clocks to the control device, and controlling an output moment of the first internal output data based on whether there is a mismatch between the differential clocks; and a second semiconductor device suitable for outputting a second internal output data in response to the differential clocks to the control device and controlling an output moment of the second internal output data based on whether there is a mismatch between the differential clocks.

At least one of either the first semiconductor device or the second semiconductor device may delay the output moment.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 5:
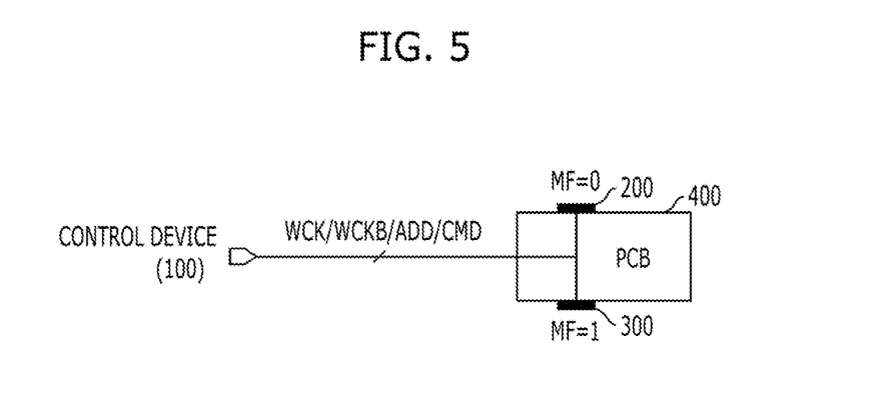
FIG. 5 is a block view of a semiconductor system in accordance with an embodiment of the present invention.

FIG. 5 is a block view of a semiconductor system in accordance with an embodiment of the present invention. Referring to FIG. 5, the semiconductor system includes a control device 100, first and second semiconductor devices 200 and 300, and a substrate 400. The control device 100 generates differential clocks WCK and WCKB, addresses ADD, and a read command CMD. The first and second semiconductor devices 200 and 300 perform a read operation in response to the differential clocks WCK and WCKB, the addresses ADD, and the read command CMD. The substrate 400 includes a routing path for transferring the differential clocks WCK and WCKB, the addresses ADD, and the read command CMD.

Herein, the control device 100 includes a processor such as a Graphic Processing Unit (GPU).

The first semiconductor device 200 outputs a first internal output data MXOUT_MF0 (see FIG. 6) synchronized with the differential clocks WCK and WCKB to the control device 100 under the control of the control device 100. The first semiconductor device 200 may control an output moment of the first internal output data MXOUT_MF0 depending on whether there is a mismatch between the differential clocks WCK and WCKB.

Also, the second semiconductor device 300 outputs a second internal output data MXOUT_MF1 (see FIG. 11) synchronized with the differential clocks WCK and WCKB to the control device 100 under the control of the control device 100. The second semiconductor device 300 may control an output moment of the second internal output data MXOUT_MF1 depending on whether there is a mismatch between the differential clocks WCK and WCKB.

The first and second semiconductor devices 200 and 300 may include a memory device, such as a Dynamic Random Access Memory (DRAM) device. The first semiconductor device 200 is mounted on one side of the substrate 400, while the second semiconductor device 300 is mounted on the other side of the substrate 400, so they mirror each other. The first semiconductor device 200 is referred to as a main semiconductor device, and the second semiconductor device 300 is referred to as a mirrored semiconductor device.

Since the main semiconductor device 200 and the second semiconductor device 300 have a mirrored structure, the array of pads are opposite each other and receive the same signal input. For example, a positive clock pad of the main semiconductor device 200 and a negative clock pad of the mirrored semiconductor device 300 are facing each other, while a negative clock pad of the main semiconductor device 200 and a positive clock pad of the mirrored semiconductor device 300 are facing each other. Therefore, a positive clock WCK of the differential clocks WCK and WCKB is inputted to the positive clock pad of the main semiconductor device 20 and the negative clock pad of the mirrored semiconductor device 30, which face each other. A negative clock WCKB of the differential clocks WCK and WCKB is inputted to the negative clock pad of the main semiconductor device 20 and the positive clock pad of the mirrored semiconductor device 30, which face each other.

A signal may be inputted to the main semiconductor device 200 through a designated pad, while a signal is not inputted to the mirrored semiconductor device 300 through a designated pad. Therefore, a signal representing which semiconductor device is mirrored, called the mirror function signal MF, is required.

The mirror function signal MF is disabled in the main semiconductor device 200 (MF=0) while the mirror function signal MF is enabled in the mirrored semiconductor device 300 (MF=1). Therefore, the main semiconductor device 200 uses the signals inputted through the corresponding pads in response to the disabled mirror function signal MF, whereas the mirrored semiconductor device 300 uses the signals inputted through the corresponding pads by reallocating them in response to the enabled mirror function signal MF.

Also, the substrate 400 may include a printed circuit board (PCB).

Figure 6:
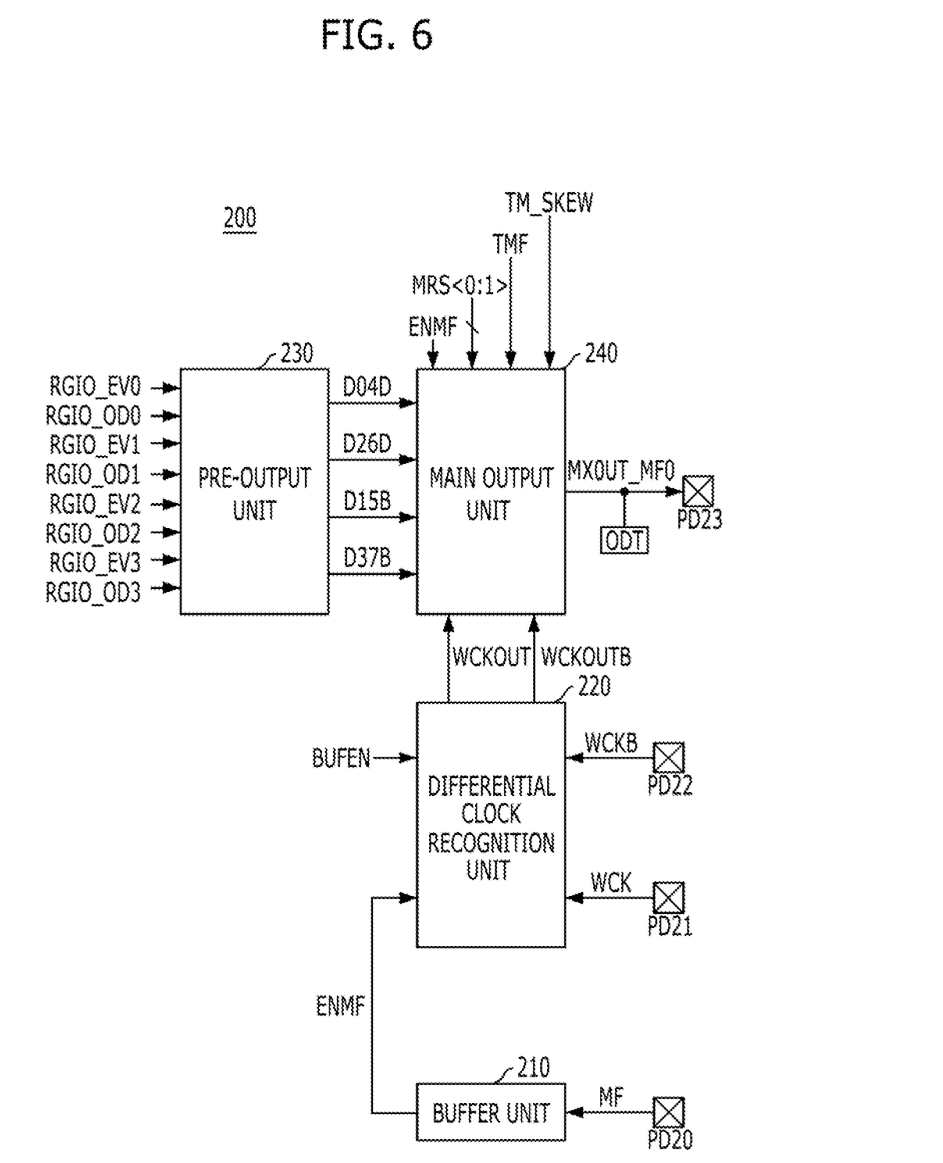
FIG. 6 is a block view illustrating an example of a main semiconductor device 200 shown in FIG. 5.

FIG. 6 is a block view illustrating an internal structure of the main semiconductor device 200 shown in FIG. 5. Referring to FIG. 6, the main semiconductor device 200 includes a buffer unit 210, a differential clock recognition unit 220, a pre-output unit 230, a main output unit 240, a data pad PD23, and an On Die Termination (ODT). The buffer unit 210 generates a mirror function enable signal ENMF by buffering a mirror function signal MF inputted through a mirror function pad PD20. The differential clock recognition unit 220 recognizes a positive clock WCK inputted through a positive clock pad PD21 as an internal positive clock WCKOUT and recognizes a negative clock WCKB inputted through a negative clock pad PD22 as an internal negative clock WCKOUTB in response to the mirror function enable signal ENMF and an operation enable signal BUFEN. The pre-output unit 230 serializes first to eighth internal parallel data RGIO_EV0 to RGIO_OD3 in pairs and outputs first to fourth pre-parallel data D04D to D37B. The main output unit 240 outputs the first to fourth pre-parallel data D04D to D37B as first read data MXOUT_MF0 in response to the internal differential clocks WCKOUT and WCKOUTB, which are outputted from the differential clock recognition unit 220. The output moment of the first read data MXOUT_MF0 is controlled in response to the mirror function enable signal ENMF and the output moment control signals TMF and TM_SKEW. The data pad PD23 provides the control device 100 with the first read data MXOUT_MF0. The ODT is coupled between the main output unit 240 and the data pad PD23.

The mirror function signal MF includes a signal that is fixed at a predetermined voltage level. For example, the mirror function pad PD20 is coupled with a ground voltage terminal (not shown in the drawing), and thus the mirror function signal MF is disabled to a logic low level (MF=0).

The differential clock recognition unit 220 recognizes that the predetermined positive clock WCK and negative clock WCKB are inputted through the positive clock pad PD21 and the negative clock pad PD22 based on the disabled mirror function enable signal ENMF, and outputs the internal positive clock WCKOUT and the internal negative clock WCKOUTB that correspond to the positive clock WCK and the negative clock WCKB.

Figure 7:
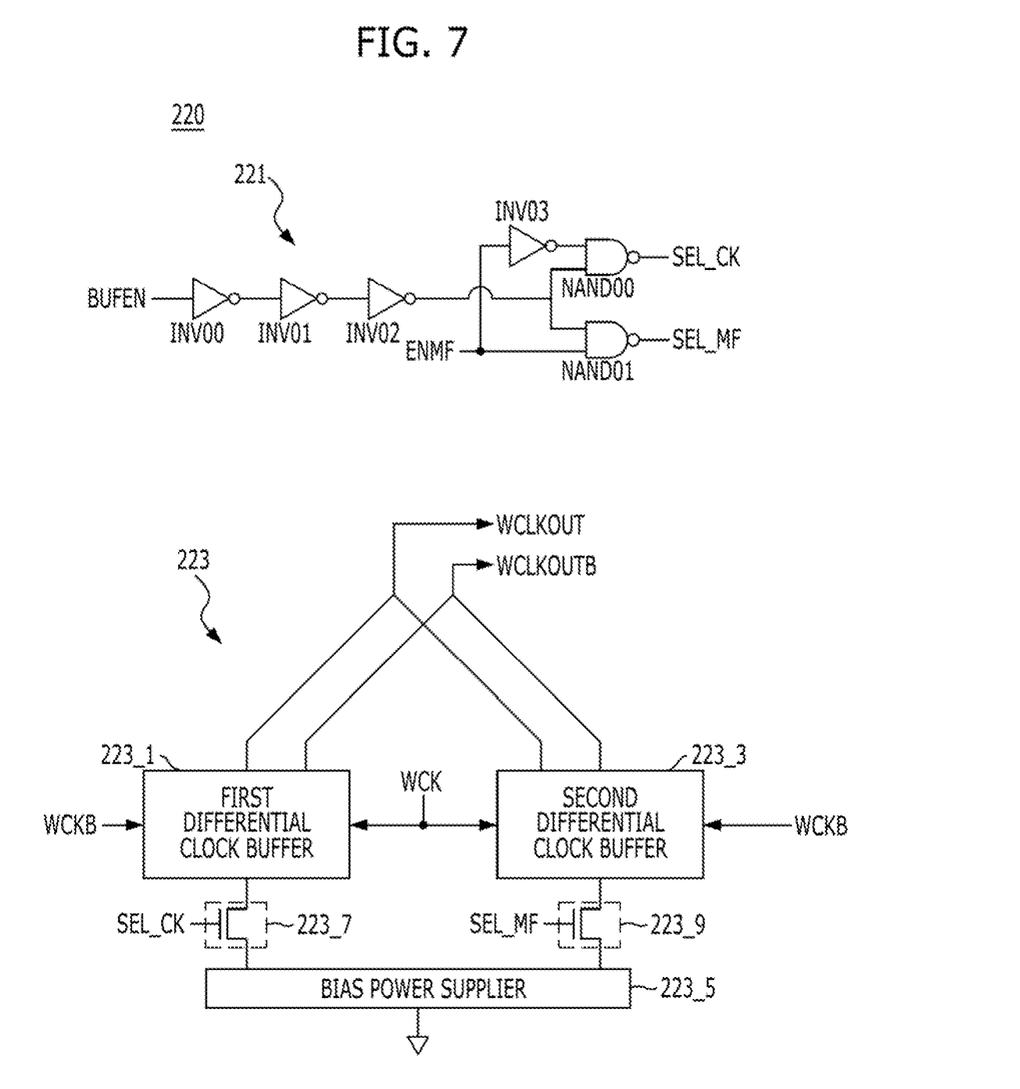
FIG. 7 is a block view illustrating an example of a differential clock recognition unit 220 shown in FIG. 6.

FIG. 7 is a block view illustrating an example of the differential clock recognition unit 220 shown in FIG. 6.

Referring to FIG. 7, the differential clock recognition unit 220 may include a selection controller 221 and a differential clock buffer 223. The selection controller 221 generates a first selection control signal SEL_CK and a second selection control signal SEL_MF in response to the operation enable signal BUFEN and the mirror function enable signal ENMF. The differential clock buffer 223 outputs the internal differential clocks WCKOUT and WCKOUTB that correspond to the differential clocks WCK and WCKB in response to the first selection control signal SEL_CK and the second selection control signal SEL_MF.

The selection controller 221 may include a first inverter INV00, a second inverter INV01, a third inverter INV02, a fourth inverter INV03, a first NAND gate NAND00, and a second NAND gate NAND01. The first inverter INV00 inverts the operation enable signal BUFEN. The second inverter INV01 inverts an output signal of the first inverter INV00. The third inverter INV02 inverts an output signal of the second inverter INV01. The fourth inverter INV03 inverts the mirror function enable signal ENMF. The first NAND gate NAND00 performs a NAND operation on the output signals of the third inverter INV02 and the fourth inverter INV03 to output the first selection control signal SEL_CK. The second NAND gate NAND01 performs a NAND operation on the output signal of the third inverter INV02 and the mirror function enable signal ENMF to output the second selection control signal SEL_MF. The selection controller 221 having the above structure enables either the first selection control signal SEL_CK or the second selection control signal SEL_MF in response to the mirror function enable signal ENMF, when the operation enable signal BUFEN is enabled (for example, when the operation enable signal BUFEN is at a logic high level).

The differential clock buffer 223 includes a first differential clock buffer 223_1, a second differential clock buffer 223_3, a bias power supplier 223_5, a first coupler 223_7, and a second coupler 223_9.

The first differential clock buffer 223_1 outputs the positive clock WCK as the internal positive clock WCKOUT and the negative clock WCKB as the internal negative clock WCKOUTB. The second differential clock buffer 223_3 outputs the positive clock WCK as the internal negative clock WCKOUTB and the negative clock WCKB as the internal positive clock WCKOUT. The bias power supplier 223_5 supplies bias power. The first coupler 223_7 couples the first differential clock buffer 223_1 with the bias power supplier 223_5 in response to the first selection control signal SEL_CK. The second coupler 223_9 couples the second differential clock buffer 223_3 with the bias power supplier 223_5 in response to the second selection control signal SEL_MF. For example, the differential clock buffer 223 enables the first differential clock buffer 223_1 as the first selection control signal SEL_CK is enabled.

Figure 8:
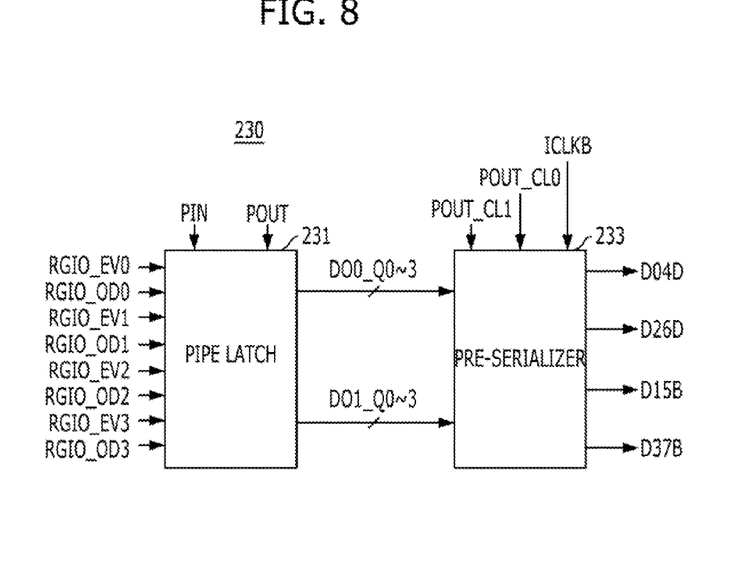
FIG. 8 is a block view illustrating an example of a pre-output unit 230 shown in FIG. 6.

FIG. 8 is a block view illustrating an example of the pre-output unit 230 shown in FIG. 6.

Referring to FIG. 8 the pre-output unit 230 may include a pipe latch 231, and a pre-serializer 233. The pipe latch 231 receives first to eighth internal parallel data RGIO_EV0 to RGIO_OD3 in response to a pipe in signal PIN and outputs first pipe parallel data DO0_Q0 to DO0_Q3 and second pipe parallel data DO1_Q0 to DO1_Q3 in response to a pipe out signal POUT. The pre-serializer 233 receives the first pipe parallel data DO0_Q0 to DO0_Q3 and the second pipe parallel data DO1_Q0 to DO1_Q3 and outputs first to fourth pre-parallel data D04D to D37B in response to a first output control signal POUT_CL1, a second output control signal POUT_CL0, and an internal clock ICLKB.

Figure 9:
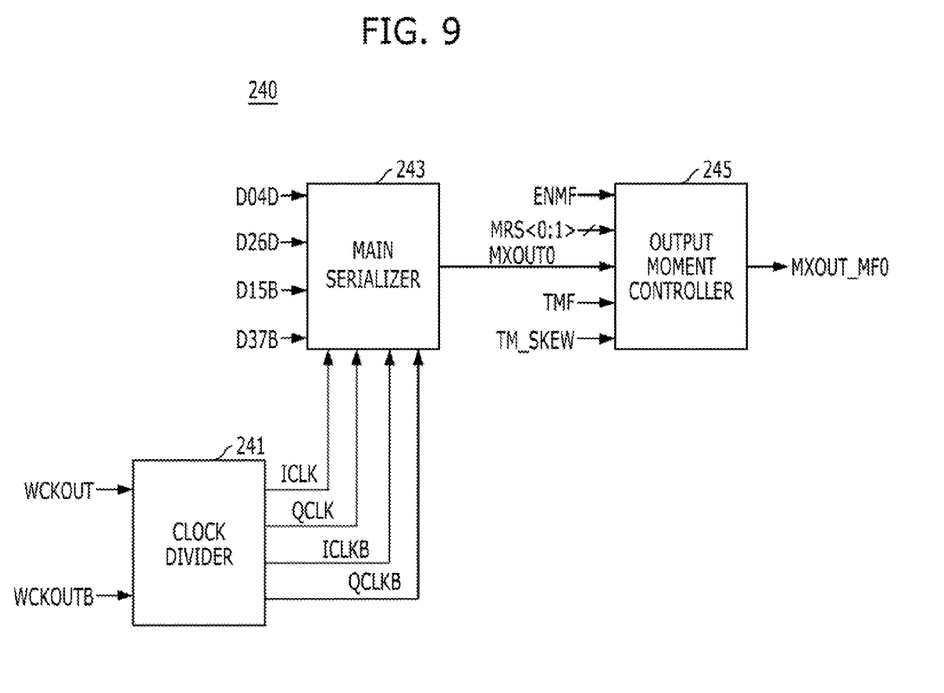
FIG. 9 is a block view illustrating an example of a main output unit 240 shown in FIG. 6.
Figure 10:
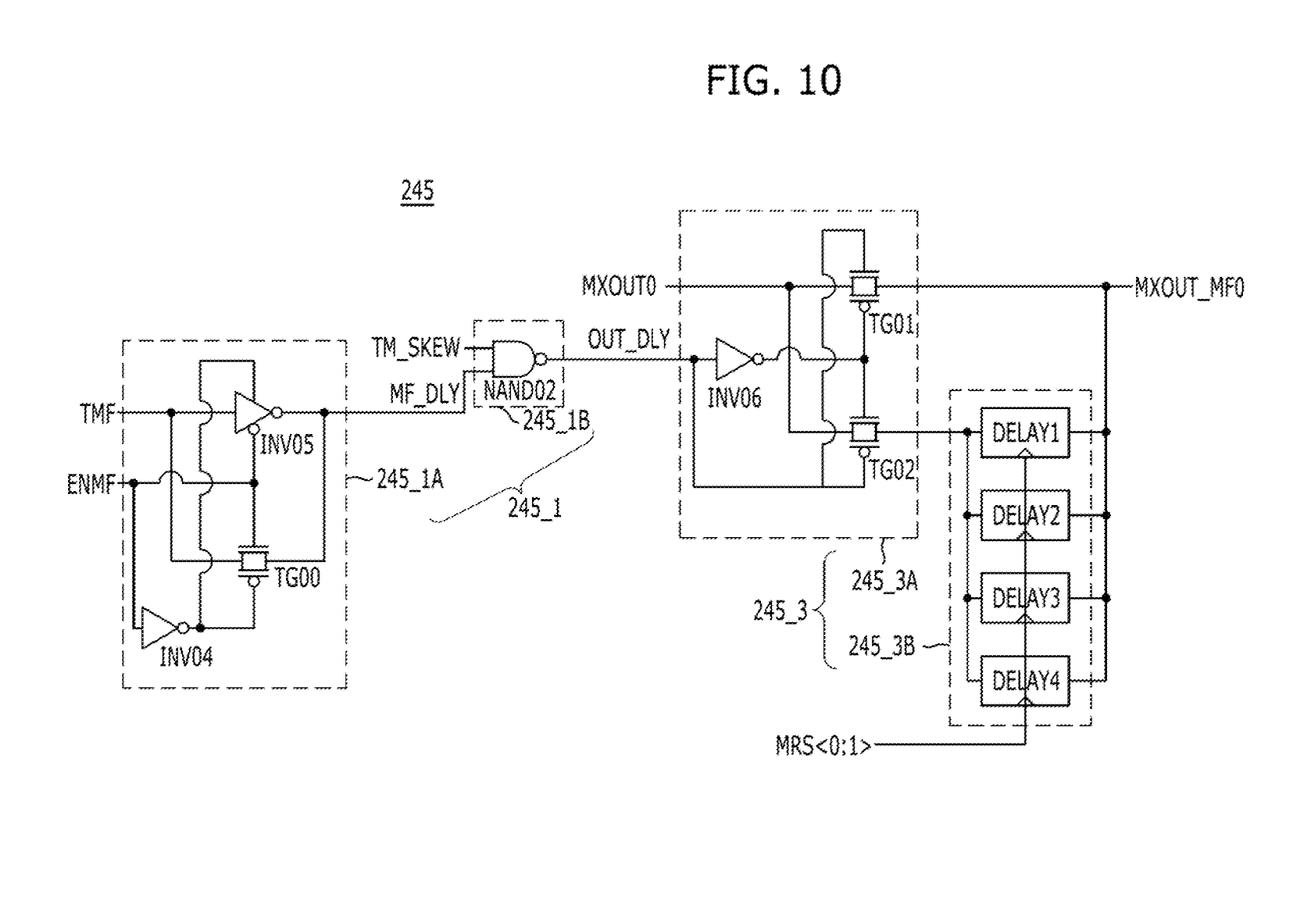
FIG. 10 is a block view illustrating an example of an output moment controller shown in FIG. 9.

FIG. 9 is a block view illustrating an example of the main output unit 240 shown in FIG. 6. FIG. 10 is a block view illustrating an example of an output moment controller 245 shown in FIG. 9.

Referring to FIG. 9, the main output unit 240 may include a synchronization block 241 and 243 and an output moment controller 245. The synchronization block 241 and 243 receives the first to fourth pre-parallel data D04D to D37B and outputs a first internal serial data MXOUT0 in response to the internal differential clocks WCKOUT and WCKOUTB. The output moment controller 245 controls the output moment of the first internal serial data MXOUT0 in response to the mirror function enable signal ENMF, a Mode Register Set (MRS) code MRS<0:1>, and the output moment control signals TMF and TM_SKEW.

The synchronization block 241 and 243 may include a clock divider 241 and a main serializer 243. The clock divider 241 divides the internal differential clocks WCKOUT and WCKOUTB and outputs first to fourth divided clocks ICLK, QCLK, ICLKB and QCLKB. The main serializer 243 serializes the first to fourth pre-parallel data D04D to D37B and outputs the first internal serial data MXOUT0 in response to the first to fourth divided clocks ICLK, QCLK, ICLKB and QCLKB.

As illustrated in FIG. 10, the output moment controller 245 may include an output control portion 245_1 and a delay output portion 245_3. The output control portion 245_1 generates an output delay signal OUT_DLY in response to the mirror function enable signal ENMF and the output moment control signals TMF and TM_SKEW. The delay output portion 245_3 delays the first internal serial data MXOUT0 by a predetermined delay time in response to the output delay signal OUT_DLY and outputs a first read data MXOUT_MF0. Herein, the output moment control signals TMF and TM_SKEW may include a skew correction signal TMF and an output moment change signal TM_SKEW. The skew correction signal TMF represents whether to correct the skew of the first internal serial data MXOUT0 or not. The output moment change signal TM_SKEW represents whether to change the output moment of the first internal serial data MXOUT0 or not. The skew correction signal TMF and the output moment change signal TM_SKEW may be defined using a fuse circuit during a test mode.

The output control portion 245_1 may include a correction controlling element 245_1A and a delay controlling element 245_1B. The correction controlling element 245_1A generates a delay control signal MF_DLY by inverting or not inverting the skew correction signal TMF in response to the mirror function enable signal ENMF. The delay controlling element 245_1B generates the output delay signal OUT_DLY from a logical combination of the delay control signal MF_DLY and the output moment change signal TM_SKEW.

The correction controlling element 245_1A may include a fifth inverter INV04, a sixth inverter INV05, and a first transfer gate TG00. The fifth inverter INV04 inverts the mirror function enable signal ENMF. The sixth inverter INV05 outputs an inverted skew correction signal by inverting the skew correction signal TMF in response to the output signal of the fifth inverter INV04 and the mirror function enable signal ENMF. The first transfer gate TG00 outputs the skew correction signal TMF without inverting the skew correction signal TMF in response to the output signal of the fifth inverter INV04 and the mirror function enable signal ENMF. The delay controlling element 245_1B performs a NAND operation on the delay control signal MF_DLY and the output moment change signal TM_SKEW.

The delay output portion 245_3 may include a path providing element 245_3A and a delaying element 245_3B. The path providing element 245_3A selectively provides a normal path for outputting the first internal serial data MXOUT0 as the first read data MXOUT_MF0 without a delay and a delay path for outputting the first internal serial data MXOUT0 as the first read data MXOUT_MF0 by delaying the first internal serial data MXOUT0 by a predetermined delay time in response to the output delay signal OUT_DLY. The delaying element 245_3B is coupled with the delay path and outputs the first internal serial data MXOUT0 as the first read data MXOUT_MF0 by delaying the first internal serial data MXOUT0 by a predetermined delay time.

The path providing element 245_3A may include a seventh inverter INV06, a second transfer gate TG01, and a third transfer gate TG02. The seventh inverter INV06 inverts the output delay signal OUT_DLY. The second transfer gate TG01 receives the first internal serial data MXOUT0 and outputs the first read data MXOUT_MF0 in response to the output signal of the seventh inverter INV06 and the output delay signal OUT_DLY. The third transfer gate TG02 transfers the first internal serial data MXOUT0 to the delaying element 245_3B in response to the output signal of the seventh inverter INV06 and the output delay signal OUT_DLY. The delaying element 245_3B may include a plurality of delayers DELAY1 to DELAY4 which are coupled in parallel with the delay path and have different delay times. Herein, one among the multiple delayers DELAY1 to DELAY4 may be enabled based on the MRS code MRS<0:1>.

Figure 11:
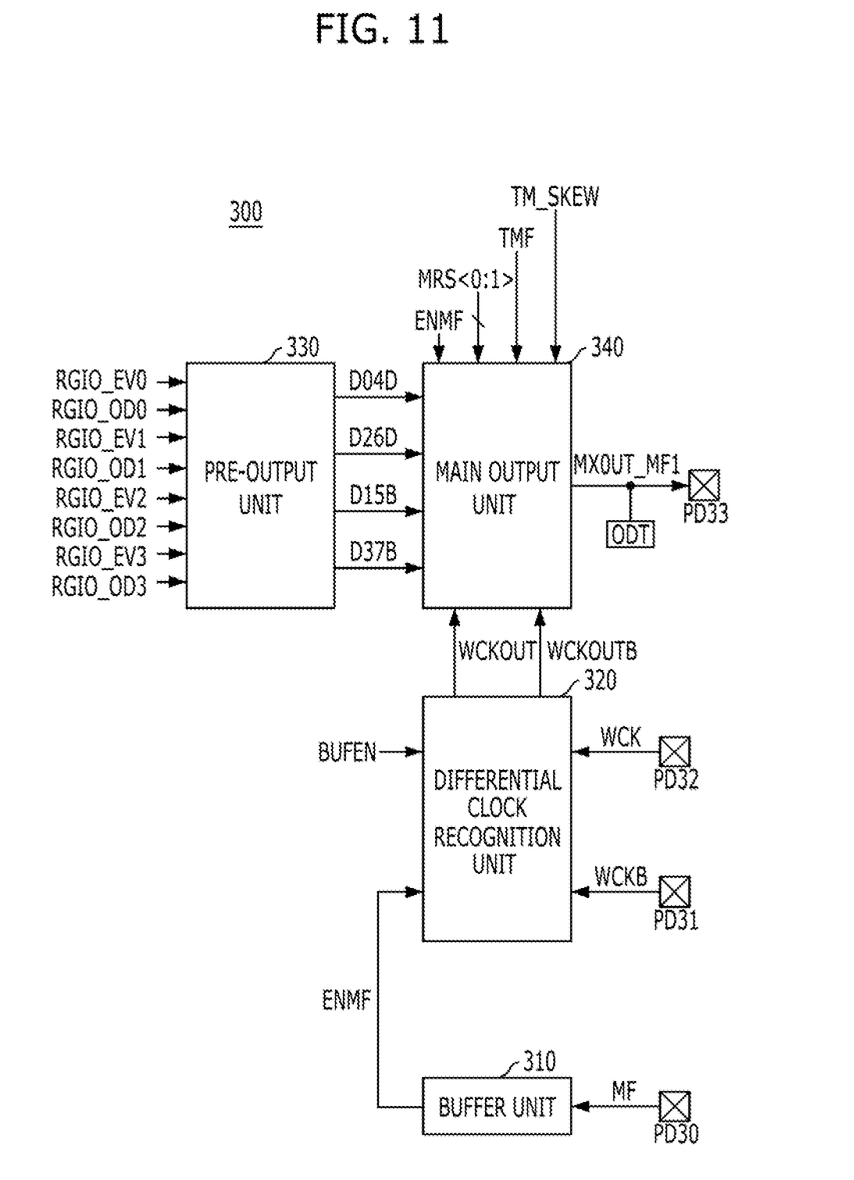
FIG. 11 is a block view illustrating a mirrored semiconductor device 300 shown in FIG. 5.

FIG. 11 is a block view illustrating the mirrored semiconductor device 300 shown in FIG. 5. Referring to FIG. 11, the mirrored semiconductor device 300 includes a buffer unit 310, a differential clock recognition unit 320, a pre-output unit 330, a main output unit 340, a data pad PD33 and an On Die Termination (ODT). The buffer unit 310 generates a mirror function enable signal ENMF by buffering a mirror function signal MF inputted through a mirror function pad PD30. The differential clock recognition unit 320 recognizes and outputs a negative clock WCKB inputted through a positive clock pad PD31 as an internal negative clock WCKOUTB and recognizes and outputs a positive clock WCK inputted through a negative clock pad PD32 as an internal positive clock WCKOUT in response to the mirror function enable signal ENMF and an operation enable signal BUFEN. The pre-output unit 330 serializes first to eighth internal parallel data RGIO_EV0 to RGIO_OD3 in pairs and outputs first to fourth pre-parallel data D04D to D37B. The main output unit 340 outputs the first to fourth pre-parallel data D04D to D37B as a second read data MXOUT_MF1 in response to the internal differential clocks WCKOUT and WCKOUTB, which are outputted from the clock recognition unit 320, while controlling the output moment of the second read data MXOUT_MF1 in response to the mirror function enable signal ENMF and the output moment control signals TMF and TM_SKEW. The data pad PD33 supplies the second read data MXOUT_MF1 to the control device 100. The ODT is coupled between the main output unit 340 and the data pad PD33.

The mirror function signal MF includes a signal that is fixed at a predetermined voltage level. For example, the mirror function pad PD30 is coupled with a power supply voltage terminal (not shown in the drawing) and thus the mirror function signal MF is enabled to a logic high level (MF=1).

The differential clock recognition unit 320 recognizes that the negative clock WCKB and the positive clock WCK, which are not supposed to be inputted, are inputted through the positive clock pad PD31 and the negative clock pad PD32 based on the enabled mirror function enable signal ENMF, and reallocates the negative clock WCKB and the positive clock WCK and outputs an internal positive clock WCKOUT and an internal negative clock WCKOUTB.

Figure 12:
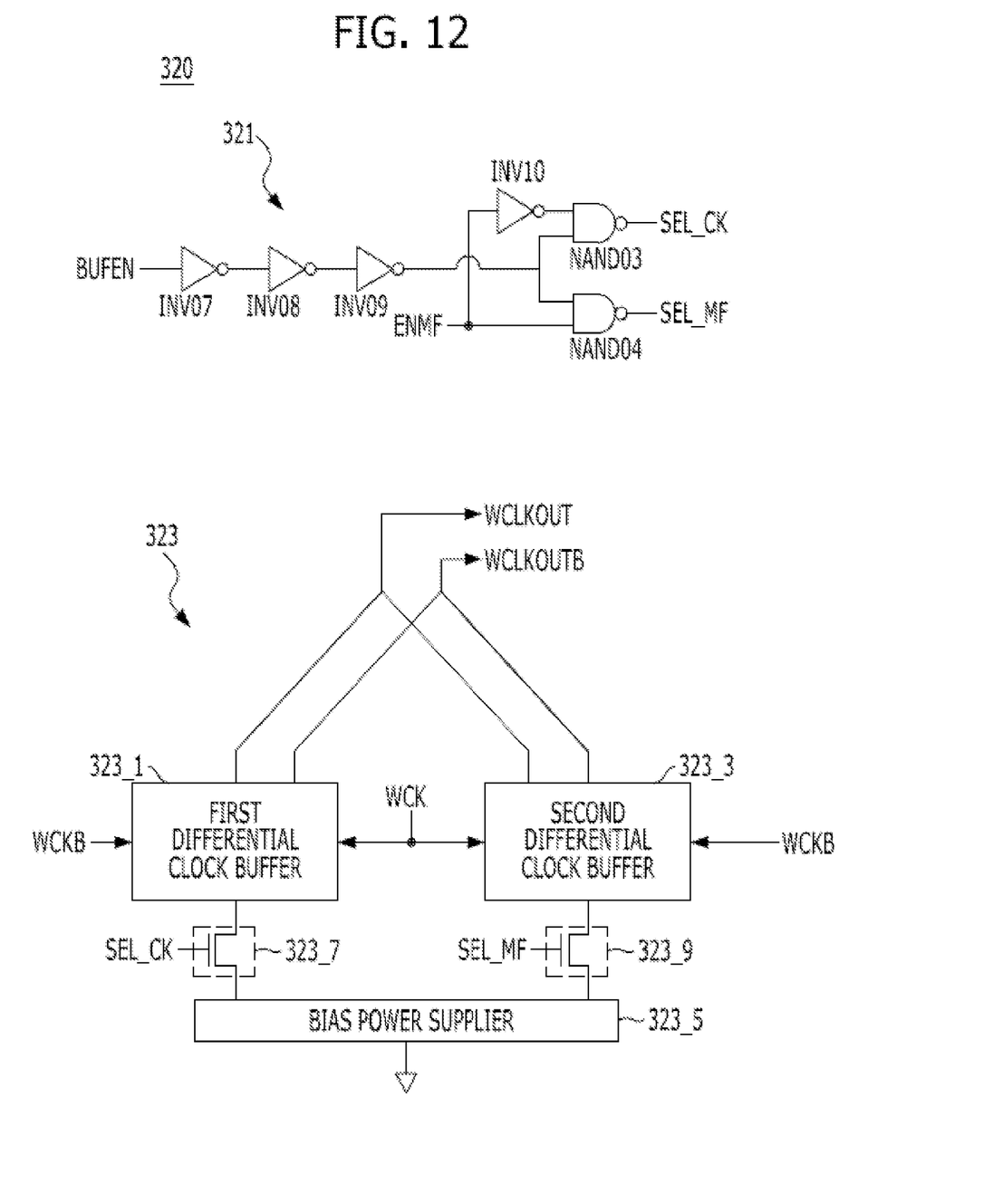
FIG. 12 is a block view illustrating an example of a differential clock recognition unit 320 shown in FIG. 11.

FIG. 12 is a block view illustrating an example of the differential clock recognition unit 320 shown in FIG. 11.

Referring to FIG. 12, the differential clock recognition unit 320 may include a selection controller 321 and a differential clock buffer 323. The selection controller 321 generates a first selection control signal SEL_CK and a second selection control signal SEL_MF in response to the operation enable signal BUFEN and the mirror function enable signal ENMF. The differential clock buffer 323 outputs the internal differential clocks WCKOUT and WCKOUTB that correspond to the differential clocks WCK and WCKB in response to the first selection control signal SEL_CK and the second selection control signal SEL_MF.

The selection controller 321 may include an eighth inverter INV07, a ninth inverter INV08, a tenth inverter INV09, an 11$^{th}$ inverter INV10, a forth NAND gate NAND03, and a fifth NAND gate NAND04. The eighth inverter INV07 inverts the operation enable signal BUFEN. The ninth inverter INV08 inverts an output signal of the eighth inverter INV07. The tenth inverter INV09 inverts an output signal of the ninth inverter INV08. The 11$^{th}$ inverter INV10 inverts the mirror function enable signal ENMF. The forth NAND gate NAND03 performs a NAND operation on the output signals of the tenth inverter INV09 and the 11$^{th}$ inverter INV10 to output the first selection control signal SEL_CK. The fifth NAND gate NAND04 performs a NAND operation on the output signal of the tenth inverter INV09 and the mirror function enable signal ENMF to output the second selection control signal SEL_MF. The selection controller 321 having the above structure enables either the first selection control signal SEL_CK or the second selection control signal SEL_MF in response to the mirror function enable signal ENMF, when the operation enable signal BUFEN is enabled (for example, when the operation enable signal BUFEN is at a logic high level).

The differential clock buffer 323 includes a first differential clock buffer 323_1, a second differential clock buffer 323_3, a bias power supplier 323_5, a first coupler 323_7, and a second coupler 323_9.

The first differential clock buffer 323_1 outputs the positive clock WCK as the internal positive clock WCKOUT and the negative clock WCKB as the internal negative clock WCKOUTB. The second differential clock buffer 323_3 outputs the positive clock WCK as the internal negative clock WCKOUTB and the negative clock WCKB as the internal positive clock WCKOUT. The bias power supplier 323_5 supplies bias power. The first coupler 323_7 couples the first differential clock buffer 323_1 with the bias power supplier 323_5 in response to the first selection control signal SEL_CK. The second coupler 323_9 couples the second differential clock buffer 323_3 with the bias power supplier 323_5 in response to the second selection control signal SEL_MF. For example, the differential clock buffer 323 enables the second differential clock buffer 323_3 as the second selection control signal SEL_MF is enabled.

Since the structures of the pre-output unit 330 and the main output unit 340 are the same as those of the pre-output unit 230 and the main output unit 240 of the main semiconductor device 200, further descriptions will not be provided (refer to FIGS. 8 to 10).

A semiconductor system operation in accordance with an embodiment of the present invention will now be described with reference to FIG. 13.

Figure 13:
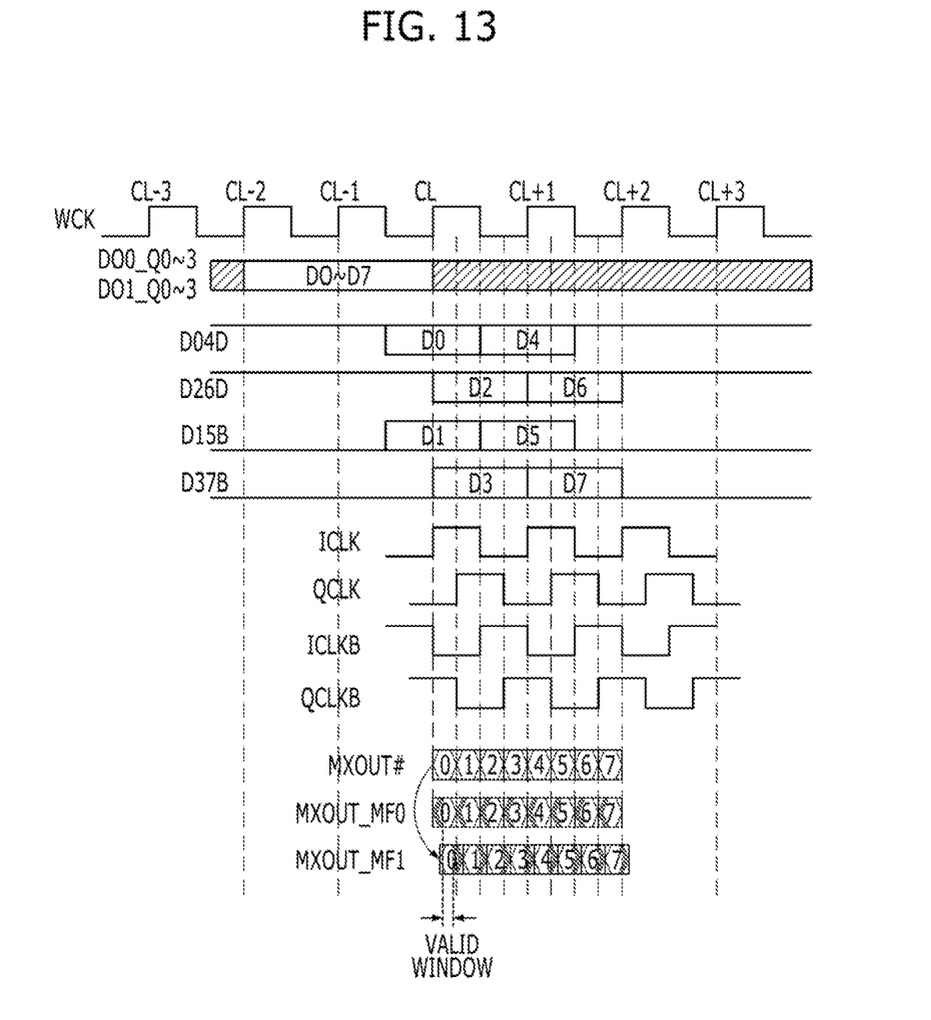
FIG. 13 is a timing diagram describing the operation of a semiconductor system in accordance with an embodiment of the present invention.

In FIG. 13 the first read data MXOUT_MF0 outputted from the main semiconductor device 200 has skew from the data eye pattern to the left side, whereas the second read data MXOUT_MF1 outputted from the mirrored semiconductor device 300 has skew from the data eye pattern to the right side.

FIG. 13 is a timing diagram describing the operation of the semiconductor system in accordance with an embodiment of the present invention.

Referring to FIG. 13, the main semiconductor device 200 and the mirrored semiconductor device 300 perform a data read operation under the control of the control device 100. For example, the main semiconductor device 200 and the mirrored semiconductor device 300 perform a read operation in response to differential clocks WCK and WCKB, a read command CMD, and row and column addresses ADD.

First, the operation of the main semiconductor device 200 will be described. The differential clock recognition unit 220 recognizes and outputs a clock WCK inputted through the positive clock pad PD21 as an internal positive clock WCKOUT and recognizes and outputs a clock WCKB inputted through the negative clock pad PD22 as an internal negative clock WCKOUTB in response to a disabled mirror function enable signal ENMF.

In this state, the pre-output unit 230 serializes the first to eighth internal parallel data RGIO_EV0 to RGIO_OD3 that are read through a the read operation in pairs and outputs first to fourth pre-parallel data D04D to D37B. The main output unit 240 outputs a first read data MXOUT_MF0 through the data pad PD23 in response to the internal differential clocks WCKOUT and WCKOUTB, while controlling the output moment of the first read data MXOUT_MF0 in response to the mirror function enable signal ENMF and the output moment control signals TMF and TM_SKEW.

The operation of the main output unit 240 will now be described in detail. The clock divider 241 outputs first to fourth divided clocks ICLK to QCLKB which have a phase difference of approximately 90° from each other by dividing the internal differential clocks WCKOUT and WCKOUTB. The main serializer 243 serializes the first to fourth pre-parallel data D04D to D37B and outputs the first internal serial data MXOUT0. The output moment controller 245 outputs the first internal serial data MXOUT0 as the first read data MXOUT_MF0 at a predetermined output moment, such as CAS Latency (CL), without controlling the output moment in response to the mirror function enable signal ENMF and the output moment control signals TMF and TM_SKEW.

The operation of the output moment controller 245 will now be described in detail. The correction controlling element 245_1A inverts a skew correction signal TMF of a logic high level and outputs a delay control signal MF_DLY of a logic low level in response to the mirror function enable signal ENMF that is disabled to a logic low level. When the delay controlling element 245_1B performs a NAND operation on the delay control signal MF_DLY of a logic low level and an output moment change signal TM_SKEW of a logic high level and outputs an output delay signal OUT_DLY of a logic high level, the path providing element 245_3A outputs the first internal serial data MXOUT0 as the first read data MXOUT_MF0 through the normal path without a delay.

Subsequently, the operation of the mirrored semiconductor device 300 is described. The differential clock recognition unit 320 recognizes and outputs a clock WCKB inputted through the positive clock pad PD31 as an internal negative clock WCKOUTB and recognizes and outputs a clock SICK inputted through the negative clock pad PD32 as an internal positive clock WCKOUT in response to an enabled mirror function enable signal ENMF.

In this state, the pre-output unit 330 serializes the first to eighth internal parallel data RGIO_EV0 to RGIO_OD3 that are read through a read operation in pairs and outputs first to fourth pre-parallel data D04D to D37B. The main output unit 340 outputs the second read data MXOUT_MF1 corresponding to the first to fourth pre-parallel data D04D to D37B through the data pad PD33 in response to the internal differential clocks WCKOUT and WCKOUTB, while controlling the output moment of the second read data MXOUT_MF1 in response to the mirror function enable signal ENMF and the output moment control signals TMF and TM_SKEW.

Hereafter, the operation of the main output unit 340 is described in detail with reference to FIG. 9. The clock divider 241 outputs first to fourth divided clocks ICLK to QCLKB which have a phase difference of approximately 90° from each other by dividing the internal differential clocks WCKOUT and WCKOUTB. The main serializer 243 serializes the first to fourth pre-parallel data D04D to D37B and outputs a second internal serial data. The output moment controller 245 outputs the second internal serial data as the second read data MXOUT_MF1 at a moment that is delayed by a predetermined delay time from a predetermined output moment, such as CAS Latency (CL), in response to the mirror function enable signal ENMF and the output moment control signals TMF and TM_SKEW.

Hereafter, the operation of the output moment controller 245 is described in detail with reference to FIG. 10. The correction controlling element 245_1A does not invert a skew correction signal TMF of a logic high level and outputs a delay control signal MF_DLY of a logic high level in response to the mirror function enable signal ENMF that is enabled to a logic high level. When the delay controlling element 245_1B performs a NAND operation on the delay control signal MF_DLY of a logic high level and an output moment change signal TM_SKEW of a logic high level and outputs an output delay signal OUT_DLY of a logic low level, the path providing element 245_3A outputs the second internal serial data to the delaying element 245_3B through the delay path, and the delaying element 245_3B outputs the second read data MXOUT_MF1 which reflects a predetermined delay time.

To sum up, the main semiconductor device 200 and the mirrored semiconductor device 300 output the first read data MXOUT_MF0 and the second read data MXOUT_MF1 to the control device 100 at the same time theoretically. For example, the main semiconductor device 200 and the mirrored semiconductor device 300 output the first read data MXOUT_MF0 and the second read data MXOUT_MF1 to the control device 100 through the data pads PD23 and PD33 after a Column Address Strobe (CAS) latency CL) passes from a moment when the read command CMD is inputted. Next, the second read data MXOUT_MF1 is outputted after being delayed by a predetermined delay time from a predetermined output moment. Since a common valid window is sufficiently obtained between the first read data MXOUT_MF0 and the second read data MXOUT_MF1, the control device 100 may judge the first read data MXOUT_MF0 and the second read data MXOUT_MF1 at a predetermined judge point.

According to one embodiment of the present invention, since the output moment of the read data is controlled based on the mismatch occurring between the semiconductor devices, the margin of time for judging the read data may be obtained.

According to one embodiment of the present invention, the common valid window between signals may be increased in size by controlling a signal whose skew becomes different depending on a mirror function for each semiconductor device. As a result, the margin of time for judging the signals may be obtained.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a first pad suitable for receiving a first clock that is inputted from an exterior;
a second pad suitable for receiving a second clock that is inputted from the exterior;
a differential clock recognition unit suitable for recognizing either the first clock or the second clock as a positive clock of differential clocks and recognizing the other as a negative clock of the differential clocks in response to a mirror function signal which represents whether a mirror function is enabled or not to the semiconductor device;
an output unit suitable for outputting an internal signal as an output signal in response to the differential clocks and controlling an output moment of the output signal in response to the mirror function signal and an output moment control signal; and
a third pad suitable for supplying the output signal to the exterior,
wherein the output moment control signal includes a skew correction signal that represents whether to correct a skew of the output signal or not and an output moment change signal that represents whether to change the output moment of the output signal or not.

2. The semiconductor device of claim 1, wherein the output unit delays the internal signal by a delay time and outputs a delayed internal signal as the output signal.

3. The semiconductor device of claim 2, wherein the output unit controls the delay time based on a Mode Register Set (MRS) code.

4. The semiconductor device of claim 1, further comprising:
a fuse circuit suitable for generating the skew correction signal and the output moment change signal.

5. The semiconductor device of claim 1, further comprising:
an On Die Termination (ODT) coupled between the output unit and the third pad.

6. A semiconductor device, comprising:
a first pad suitable for receiving a first clock that is inputted from an exterior;
a second pad suitable for receiving a second clock that is inputted from the exterior;
a selection control unit suitable for generating a selection control signal in response to a buffer enable signal and a mirror function signal which represents whether a mirror function is enabled or not to the semiconductor device;
a differential clock buffer unit suitable for outputting either the first clock or the second clock as a positive clock of differential clocks and outputting the other as a negative clock of the differential clocks in response to the selection control signal;
a synchronization block unit suitable for outputting internal parallel data as internal serial data in response to the differential clocks;
an output moment control unit suitable for controlling an output moment of the internal serial data in response to the mirror function signal and an output moment control signal; and
a third pad suitable for supplying an output data outputted from the output moment control unit to the exterior,
wherein the output moment control signal includes a skew correction signal that represents whether to correct a skew of the output data or not and an output moment change signal that represents whether to change the output moment of the output data or not.

7. The semiconductor device of claim 6, wherein:
the selection control signal includes a first selection signal and a second selection signal; and
the selection control unit enables either the first selection signal and the second selection signal in response to the mirror function signal, when the buffer enable signal is enabled.

8. The semiconductor device of claim 6, wherein:
the selection control signal includes a first selection signal and a second selection signal; and
the differential clock buffer unit includes:
a first differential clock buffer suitable for outputting the first clock as the positive clock and outputting the second clock as the negative clock in response to the first selection signal; and
a second differential clock buffer suitable for outputting the first clock as the negative clock and outputting the second clock as the positive clock in response to the second selection signal.

9. The semiconductor device of claim 6, wherein:
the selection control signal includes a first selection signal and a second selection signal; and
the differential clock buffer unit includes:
a bias power supplier suitable for supplying a bias power;
a first differential clock buffer suitable for outputting the first clock as the positive clock and outputting the second clock as the negative clock;
a second differential clock buffer suitable for outputting the first clock as the negative clock and outputting the second clock as the positive clock;
a first coupler suitable for coupling the first differential clock buffer with the bias power supplier in response to the first selection signal; and
a second coupler suitable for coupling the second differential clock buffer with the bias power supplier in response to the second selection signal.

10. The semiconductor device of claim 6, wherein the output moment control unit includes:
an output control portion suitable for generating an output delay signal in response to the mirror function signal and the output moment control signal; and
a delay output portion suitable for outputting the output data by selectively delaying the internal serial data by a delay time in response to the output delay signal.

11. The semiconductor device of claim 6, wherein the output control portion includes:
a correction controlling element suitable for generating a delay control signal by selectively inverting the skew correction signal in response to the mirror function signal; and
a delay controlling element suitable for generating the output delay signal from a logical combination of the delay control signal and the output moment change signal.

12. The semiconductor device of claim 10, wherein the delay output portion includes:
a path providing element suitable for selectively providing a normal path for outputting the internal serial data as the output data and a delay path for delaying the internal serial data by the delay time and outputting a delayed internal serial data as the output data in response to the output delay signal; and
a delaying element coupled with the delay path and suitable for delaying the internal serial data by the delay time and outputting the delayed internal serial data as the output data.

13. The semiconductor device of claim 12, wherein:
the delaying element includes a plurality of delayers that are coupled in parallel with the delay path and have different delay times; and
the delayers are enabled based on a Mode Register Set (MRS) code.

14. The semiconductor device of claim 6, further comprising:
an On Die Termination (ODT) coupled between the output moment control unit and the third pad.

15. A semiconductor system, comprising:
a control device suitable for generating differential clocks;
a first semiconductor device suitable for outputting a first internal output data in response to the differential clocks to the control device and controlling an output moment of the first internal output data based on whether there is a mismatch between the differential clocks; and
a second semiconductor device suitable for outputting a second internal output data in response to the differential clocks to the control device and controlling an output moment of the second internal output data based on whether there is the mismatch between the differential clocks,
wherein the output moment of the first internal output data and the output moment of the second internal output data are controlled in response to a mirror function signal and an output moment control signal,
wherein the mirror function signal represents whether a mirror function is enabled or not to the corresponding semiconductor devices,
wherein the output moment control signal includes a skew correction signal that represents whether to correct a skew of the output signal or not and an output moment change signal that represents whether to change the output moment of the output signal or not.

16. The semiconductor system of claim 15, further comprising:
a substrate including a routing path for transferring the differential clocks,
wherein the first semiconductor device and the second semiconductor device are mounted on the substrate in a mirror structure.

17. The semiconductor system of claim 15, wherein when there is a mismatch between the differential clocks, at least one between the first semiconductor device and the second semiconductor device controls the output moment.

18. The semiconductor system of claim 17, wherein the at least one between the first semiconductor device and the second semiconductor device delays the output moment.

* * * * *